United States Patent [19]

Wiener

[11] Patent Number: 4,501,934

[45] Date of Patent: Feb. 26, 1985

[54] LOUDSPEAKER SYSTEM

[75] Inventor: David M. Wiener, Westport, Conn.

[73] Assignee: W2 Vehicle Design and Development, Westport, Conn.

[21] Appl. No.: 514,876

[22] Filed: Jul. 18, 1983

[51] Int. Cl.[3] .................. H05K 5/00

[52] U.S. Cl. .................. 179/146 E; 181/153; 381/90

[58] Field of Search .................. 179/146 E, 146 R; 381/88, 90; 181/199, 153, 155

[56] References Cited

U.S. PATENT DOCUMENTS

| | | | |
|---|---|---|---|
| 1,532,811 | 4/1925 | Graham | 179/146 E |
| 1,952,514 | 3/1934 | Selby | 179/146 E |
| 2,002,390 | 5/1935 | Crosley | 179/146 E |
| 2,896,737 | 7/1959 | Gellman | 181/153 |
| 2,905,259 | 9/1959 | Ashe | 179/146 E |
| 3,393,766 | 7/1968 | Mitchell | 179/146 E |
| 3,443,660 | 5/1969 | Virva | 179/146 E |
| 3,768,589 | 10/1973 | Nilsson | 381/90 |
| 3,816,672 | 6/1974 | Gefvert et al. | 179/146 E |
| 4,164,988 | 8/1979 | Virva | 179/146 E |

FOREIGN PATENT DOCUMENTS

| | | | |
|---|---|---|---|
| 17367 | 2/1953 | Fed. Rep. of Germany | 179/146 E |
| 2140926 | 8/1971 | Fed. Rep. of Germany | 181/153 |
| 2548095 | 10/1975 | Fed. Rep. of Germany | 181/199 |
| 1196858 | 11/1959 | France | 381/88 |
| 659818 | 10/1951 | United Kingdom | 381/88 |

*Primary Examiner*—Gene Z. Rubinson
*Assistant Examiner*—L. C. Schroeder
*Attorney, Agent, or Firm*—Barry R. Lipsitz

[57] ABSTRACT

A loudspeaker system comprises a flexible tube with a first loudspeaker mounted within one end and a second loudspeaker mounted within the other end thereof. Each loudspeaker is oriented to direct sound outwardly from the end of the tube in which it is mounted. A baffle plate is mounted within the tube, intermediate the first and second loudspeakers.

15 Claims, 5 Drawing Figures

LOUDSPEAKER SYSTEM

BACKGROUND OF THE INVENTION

The present invention relates to loudspeakers, and more particularly to a stereophonic loudspeaker system wherein loudspeakers are mounted within the opposite ends of a flexible tube.

In the design of sound reproduction systems, one of the most challenging problems is to deliver a substantial amount of sound power in a manner that will produce for a listener an acoustic sensation that resembles as closely as possible the acoustic sensation that the original sound would have produced. To date, a great deal of research and engineering has been applied in the loudspeaker art, to provide the best possible reproduction of sound from electronic sound reproduction equipment. Quality loudspeaker systems currently available are typically large and heavy, although recent technologies have been developed for the production of miniaturized speaker systems. The problem with such miniature systems has been that a certain fullness of sound, for example, the rich range of tones produced by a symphony orchestra, is missing. Larger speaker systems are better able to reproduce the desired fullness of sound.

It would be advantageous to provide a speaker system which accurately reproduces stereophonic sound. Such reproduction of sound should exhibit the desired fullness of tone across a wide frequency range. It would be further advantageous to provide such a loudspeaker system which is portable and adaptable to a variety of different mounting or placement arrangements while maintaining the desired sound quality. Such a loudspeaker system should also be relatively simple and economical to manufacture.

The present invention relates to such a loudspeaker system, which accomplishes the above-mentioned objectives through the use of a collapsable, flexible tube in which at least first and second loudspeakers are mounted. The loudspeakers are mounted at opposite ends of the tube, and oriented to direct sound outwardly from the ends of the tube.

Although loudspeakers have, in the past, been mounted in various tube-like structures, none of these have included a plurality of speakers in a single tube to provide a stereophonic loudspeaker system. For example, U.S. Pat. No. 3,393,766 to L. H. Mitchell, issued on July 23, 1968 and entitled "Speaker System", discloses the placement of a single electroacoustic transducer within a hollow tube, in order to simulate a stereophonic effect from a monophonic source. U.S. Pat. No. 4,164,988 to John J. Virva, issued on Aug. 21, 1979 and entitled "Fine Tuned, Column Speaker System" discloses a loudspeaker system having a loudspeaker connected to an adjustable air column tube. The loudspeaker is mounted at one end of the tube, with the other end of the tube being closed a damping material. Other monophonic sound reproduction structures utilizing tubes or tube-like members are shown in U.S. Pat. Nos. 1,532,811; 1,952,514; and 3,816,672. None of these patents, however, discloses or suggests the use of first and second loudspeakers, mounted within opposite ends of a flexible tube, and oriented to direct sound outwardly from the ends of the tube.

SUMMARY OF THE INVENTION

In accordance with the present invention, a loudspeaker system is provided which comprises a flexible tube, and first and second loudspeakers. Means are provided for mounting the first loudspeaker within one end of the flexible tube, with the first loudspeaker oriented to direct sound outwardly from said one end. Means are provided for mounting the second loudspeaker within the other end of the flexible tube, with the second loudspeaker oriented to direct sound outwardly from said other end. A baffle plate is mounted within the tube, intermediate the first and second loudspeakers.

The means for mounting the first and second loudspeakers can comprise first and second mounting boards to which the first and second loudspeakers are mounted, respectively, with the first mounting board adapted to fit snugly within said one end of the flexible tube, and the second mounting board adapted to fit snugly within the other end of the flexible tube. A plurality of different loudspeakers, with different frequency responses, can be mounted to each of the first and second mounting boards. When a plurality of loudspeakers is mounted to each mounting board, a separate crossover network mounted to each board can be used to interconnect the plurality of speakers thereon.

Hooks can be mounted to the flexible tube for use in suspending the loudspeaker system from above. Alternatively, the flexible tube containing the loudspeakers can be placed on the back of a sofa, whereby a listener, sitting on the sofa, can both hear the sound and feel the sound vibrations passing through the flexible tube.

The flexible tube of the loudspeaker system can be collapsable, and through the use of a handle and fasteners to maintain the tube in its collapsed position, the loudspeaker system can easily be carried. In order to facilitate the collapsing and expanding of the flexible tube, apertures are provided in the first and second mounting boards to allow for the passage of air therethrough.

By recessing the loudspeakers within the ends of the flexible tube, the speakers are hidden, presenting a nicer looking product. Recessing the speakers also enables the flexible tubing at each end to droop when the loudspeaker system is suspended from above, thereby directing the sound downwardly.

DETAILED DESCRIPTION OF A PREFERRED EMBODIMENT

Figure 1:
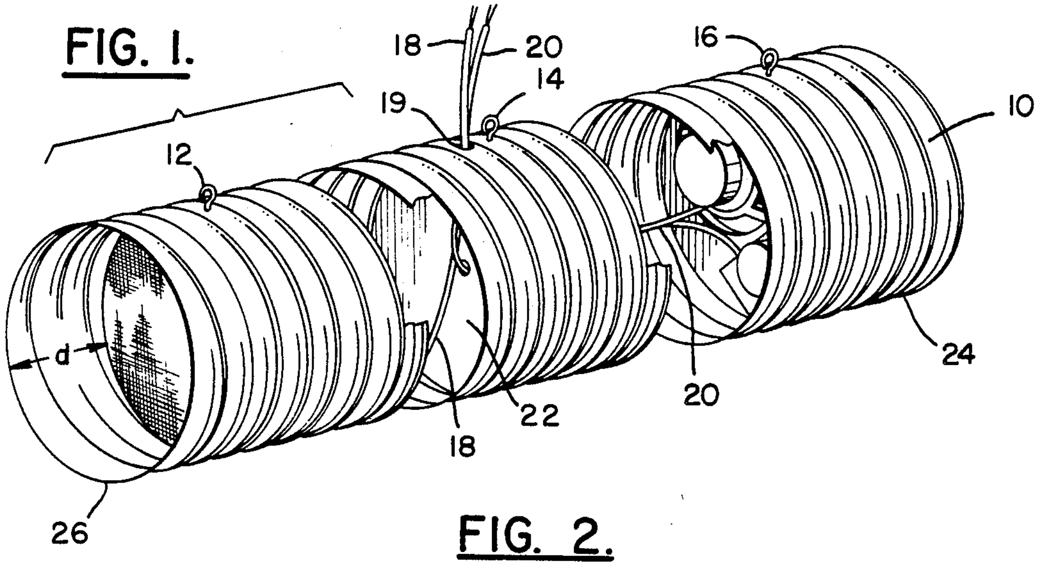
FIG. 1 is a perspective view, with partial cutaway, showing the loudspeaker system of the present invention.
Figure 2:
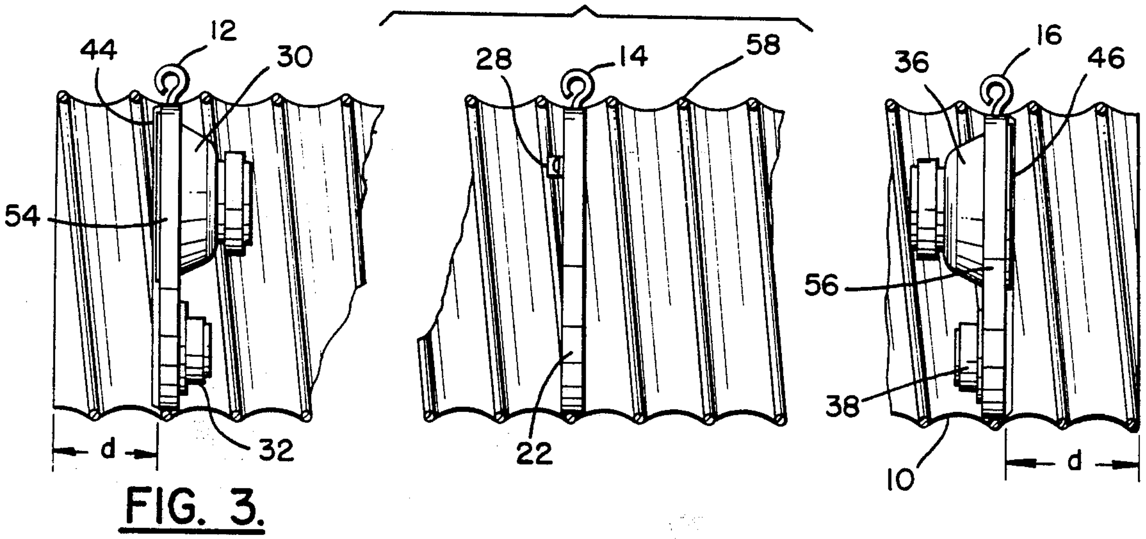
FIG. 2 is a cross-sectional view of the speaker system shown in FIG. 1.
Figure 3:
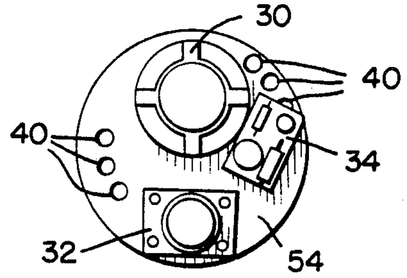
FIG. 3 is a plan view of a mounting board with loudspeakers and a crossover network attached.

Turning now to the drawings, FIG. 1 is a perspective view and FIG. 2 is a cross-sectional view of a loudspeaker system in accordance with the present invention. A collapsable and expandable flexible tube 10 contains a first loudspeaker 30 within one end 26 thereof and a second loudspeaker 36 mounted within the other end 24 thereof. A baffle plate 22 is mounted within flexible tube 10, intermediate first loudspeaker 30 and second loudspeaker 36, and serves to prevent sound from the loudspeakers at the opposite ends of tube 10 from mixing within the tube.

First loudspeaker 30 is mounted on mounting board 54, which is recessed within tube 10 a distance d from the one end 26 thereof. Second loudspeaker 36 is similarly mounted to a mounting board 56 which is recessed within tube 10 a distance d from the other end 24 thereof. The distance d is chosen in order to optimize the sound from the loudspeaker system. In a typical arrangement, flexible tube 10 will be approximately 12 inches in diameter, and be expandable to a length of greater than 12 feet. In such an instance, the distance d is typically 14 inches. It will be recognized by those skilled in the art, however, that many variables will affect the selection of distance d, and that such dimension will be different for loudspeaker systems of different lengths, diameters, etc. In addition to optimizing sound performance, the distance d is selected to enable end portions 24 and 26 of flexible tube 10 to droop downwardly when the loudspeaker system is suspended from a ceiling. In this manner, sound from an overhead loudspeaker system, in accordance with the present invention, will be directed downwardly toward the listening area.

Mounting boards 54 and 56, and baffle plate 22 are each fabricated from a rigid material, such as wood or particle board, and are adapted to fit snugly within flexible tube 10. In order to maintain mounting boards 54 and 56 and baffle plate 22 in their proper position within flexible tube 10, any known fastening means can be used. For example, the mounting boards and baffle plate can be glued within flexible tube 10 or, alternatively, screws can be driven from the outside of flexible tube 10 into the edges of the mounting boards 54, 56 and baffle plate 22.

Hooks 12 and 16 are screwed into mounting boards 54 and 56 respectively, and hook 14 is screwed into baffle plate 22, to provide means for suspending the loudspeaker system from above. For example, wires, rope, nylon filament, or the like hanging from a ceiling can be attached to hooks 12, 14, and 16, in order to suspend the loudspeaker system with ends 24 and 26 of flexible tube 10 oriented as desired.

A pluraltiy of speakers can be mounted to each of mounting boards 54 and 56. In the embodiment shown in the Figures, a bass loudspeaker 30 ("woofer") is mounted to mounting board 54, along with a tweeter loudspeaker 32. A crossover network 34, also mounted to mounting board 54, is used to interconnect woofer 30 and tweeter 32. Mounting board 56, at the other end of flexible tube 10, similarly contains a woofer loudspeaker 36, a tweeter loudspeaker 38, and a crossover network (not shown).

Woofer 30 and tweeter 32 operate with different frequency responses. Woofer 30 has its peak efficiency at low frequencies in the audible range, and tweeter 32 operates most efficiently at the high frequency end of the audible sound spectrum. Both woofer 30 and tweeter 32 are oriented to direct sound outwardly from end 26 of tube 10. Similarly, woofer 36 and tweeter 38 direct low and high frequency sounds, respectively, outwardly from end 24 of tube 10.

Apertures 40 are provided in mounting board 54 to allow the passage of air therethrough. This is particularly important to prevent damage to the loudspeakers when flexible tube 10 is collapsed and expanded. If apertures 40 were not provided, air pressure created upon the expansion and/or collapsing of flexible tube 10 could damage the loudspeaker cones. Similar apertures are also provided on mounting board 56. To further protect the loudspeakers from damage and dirt, grille cloths 44 and 46 are provided to cover the speakers.

Figure 4:
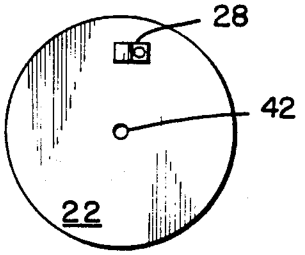
FIG. 4 is a plan view of a baffle plate.

As shown in FIG. 4, baffle plate 22 includes a hole 42 through which electrical wires can be passed, and a strain relief 28 for clamping electrical wires to baffle plate 22. Wires 18 and 20, shown in FIG. 1, are provided for coupling the loudspeakers to the output of an audio amplifier. After passing through a hole 19 in flexible tube 10, wires 18 and 20 are clamped within strain relief 28. Wires 18 then are connected to the speakers mounted on mounting board 54, whereas wires 20 are passed through hole 42 in baffle plate 22, and are connected to the speakers mounted on mounting board 56. As will be appreciated by those skilled in the art, the speakers mounted to mounting board 54 can serve as the output for one channel of a stereophonic sound system, with the speakers mounted to mounting board 56 providing the output for the other of the stereophonic channels.

Figure 5:
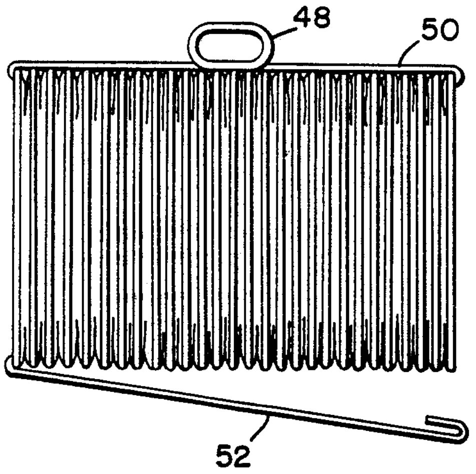
FIG. 5 is a side view of the present loudspeaker system collapsed for carrying.

The loudspeaker system of the present invention is extremely versatile. For example, flexible tube 10 can be collapsed, as shown in FIG. 5, to provide for ease in carrying the loudspeaker system. Optional clips 50 and 52 can be provided to retain the loudspeaker system in its collapsed condition for portability. A carrying handle 48 is shown attached to clip 50. Other means, such as straps and/or snaps, for retaining the loudspeaker system in a collapsed condition, will be apparent to those skilled in the art.

As noted above, hooks 12, 14, and 16 can be utilized to suspend the loudspeaker system from above. It is not necessary, however, to mount the loudspeaker system in this manner. The loudspeaker system could, for example, alternatively be stretched out and placed on the back of a sofa or other piece of furniture. With such an arrangement, a listener can sit on the furniture, lean back, and rest his or her head on flexible tube 10 to feel the music vibrations being reproduced by the loudspeaker system. Thus, the music can be both heard and felt. Other mounting and listening arrangements will occur to those using the loudspeaker system of the present invention.

In a preferred embodiment, flexible tube 10 is constructed from 12 inch diameter tube which is sold under the trademark "Ductflex" by Dayco Corporation. This tube is manufactured from fiberglass coated PVC and contains an integral, helical wire frame 58, as shown in FIG. 2. Flexible tube 10 can be any length, with lengths such as 12 feet or 25 feet being common. Shorter lengths and diameters for automobile sound systems can also be manufactured.

While the present invention has been described in connection with specific embodiments thereof and in specific uses, various modifications thereof will occur to those skilled in the art without departing from the spirit and scope of the invention as set forth in the claims appended hereto.

I claim:

1. A loudspeaker system comprising:

a flexible tube;

first and second loudspeakers;

means for mounting said first loudspeaker within one end of said flexible tube, said first loudspeaker oriented to direct sound outwardly from said one end;

means for mounting said second loudspeaker within the other end of said flexible tube, said second loudspeaker oriented to direct sound outwardly from said other end; and a baffle plate mounted within said tube, intermediate said first and second loudspeakers.

2. The loudspeaker system of claim 1, wherein said means for mounting said first loudspeaker comprises a mounting board to which said first loudspeaker is mounted, said means for mounting said second loudspeaker comprises a mounting board to which said second loudspeaker is mounted, each of said mounting boards adapted to fit snuggly within said flexible tube, and each of said mounting boards comprising at least one aperture therein to allow the passage of air therethrough.

3. The loudspeaker system of claim 2 wherein each of said mounting boards has a plurality of loudspeakers with different frequency responses mounted thereto.

4. The loudspeaker system of claim 3, further comprising a separate crossover network mounted to each mounting board for interconnecting the plurality of speakers thereon.

5. The loudspeaker system of claim 2, further comprising a plurality of hooks mounted to said flexible tube for use in suspending the loudspeaker system from above.

6. The loudspeaker system of claim 5, wherein said hooks are anchored to said baffle plate and said mounting boards.

7. The loudspeaker system of claim 1, further comprising means for coupling said first and second loudspeakers to the output of an audio amplifier.

8. The loudspeaker system of claim 1, wherein said flexible tube is collapsable from a length of greater than 6 feet to a length of less than 2 feet.

9. The loudspeaker system of claim 8, wherein said means for mounting said first and second loudspeakers comprises first and second mounting boards to which said first and second loudspeakers are mounted, respectively, said first mounting board adapted to fit snugly within said one end of said flexible tube, and said second mounting board adapted to fit snugly within the other end of said flexible tube.

10. The loudspeaker system of claim 9, further comprising at least one aperture in each of said first and second mounting boards, to allow the passage of air therethrough when said flexible tube is collapsed and expanded.

11. The loudspeaker system of claim 1 wherein said flexible tube is approximately 12 inches in diameter, and is expandable to greater than 12 feet in length.

12. The loudspeaker system of claim 11 wherein said first loudspeaker is recessed within said flexible tube at least 12 inches from said one end, and said second loudspeaker is recessed within said flexible tube at least 12 inches from said other end.

13. The loudspeaker system of claim 12 further comprising a plurality of hooks mounted to said flexible tube for use in suspending the loudspeaker system from above.

14. The loudspeaker system of claim 1, wherein said flexible tube is collapsable in length, said loudspeaker system further comprising means for retaining said tube in a collapsed position, and handle means for enabling the collapsed tube to be carried.

15. The loudspeaker system of claim 1 wherein said baffle plate is mounted midway between the ends of said flexible tube.

* * * * *